US008217679B2

(12) United States Patent  
Miller

(10) Patent No.: US 8,217,679 B2  
(45) Date of Patent: Jul. 10, 2012

(54) METHOD AND SYSTEM FOR DETERMINING POWER MEASUREMENT INSIDE A FIELD PROGRAMMABLE GATE ARRAY WITHOUT EXTERNAL COMPONENTS

(75) Inventor: Luke A. Miller, Canastota, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 12/899,885

(22) Filed: Oct. 7, 2010

(65) Prior Publication Data

US 2012/0086472 A1 Apr. 12, 2012

(51) Int. Cl.
*H03K 19/177* (2006.01)
*G01R 31/28* (2006.01)
*G06F 11/00* (2006.01)

(52) U.S. Cl. ............ 326/39; 714/725; 714/742; 716/109

(58) Field of Classification Search .............. 326/37–41, 326/47, 101; 365/185.01; 327/185; 716/109; 714/725, 742

See application file for complete search history.

(56) References Cited

U.S. PATENT DOCUMENTS

| 7,098,689 | B1 * | 8/2006 | Tuan et al. .................... 326/44 |
| 7,702,928 | B2 | 4/2010 | Schumacher et al. | |
| 2008/0007318 | A1 * | 1/2008 | Pace et al. .................... 327/396 |
| 2010/0257492 | A1 * | 10/2010 | Joshi et al. ...................... 716/1 |

OTHER PUBLICATIONS

Xilinx, "XPower Estimator User Guide", UG440 (v4.0) May 3, 2010, 36 pages.

* cited by examiner

*Primary Examiner* — Shawki S. Ismail
*Assistant Examiner* — Dylan White
(74) *Attorney, Agent, or Firm* — Howard IP Law Group, PC

(57) ABSTRACT

A method of calculating total power usage of a field programmable gate array (FPGA) without external components generates at least one coefficient based on a power equation and a given FPGA logic design, wherein the power equation calculates FPGA power as a function of temperature and voltage. The at least one coefficient is applied to the power equation along with internally generated temperature and voltage measurement values. The temperature measurement and the voltage measurement values are applied to the power equation with the at least one coefficient applied to calculate a power measurement based on the temperature measurement value and the voltage measurement value. The at least one coefficient is generated by taking an FPGA design and iteratively simulating the design in a power estimation tool over a range of temperature and input voltage values. A characterization data set is generated and curve fitted to the power equation to produce the at least one coefficient.

20 Claims, 4 Drawing Sheets

METHOD AND SYSTEM FOR DETERMINING POWER MEASUREMENT INSIDE A FIELD PROGRAMMABLE GATE ARRAY WITHOUT EXTERNAL COMPONENTS

FIELD OF THE INVENTION

The present invention relates to power measurement in a field programmable gate array (FPGA).

BACKGROUND

A field programmable gate array (FPGA) is an integrated circuit that may be designed and programmed by a user after manufacture. The FPGA is made up of logic blocks that may be configured to perform various duties, from simple logic gates to more complex functions, and may include memory elements ranging from simple flip-flops to blocks of memory. The FPGA receives electrical power through pins connected to the circuit board on which the FPGA is installed. Electrical power is supplied to the FPGA to operate logic units used as part of the specific FPGA design. Based on the function and complexity of the design, more or less power may be required to operate the FPGA when comparing one FPGA design to another.

The total power utilized by an FPGA is valuable information as to the performance and longevity of the FPGA device. It may be assumed that the more power drawn by an FPGA, the shorter the expected lifespan of the FPGA as compared to a similar device drawing less power over its lifetime. Onboard system monitoring utilities are available which provide certain operating parameters of the FPGA. For example, the die temperature of the FPGA may be measured by the system monitor and a temperature reading provided for use in diagnostics. The die temperature provides some information regarding power dissipated by the FPGA, however, temperature alone is not a reliable indicator of the total power used by an FPGA.

Power estimation tools, for example, the XPower Estimator tool from Xilinx, Inc. of San Jose, Calif., are available that estimate an FPGA design's power consumption prior to implementation based on the expected utilization of device resources, operating frequencies and toggle (switching) rates. However, these tools rely on best effort guesses of the designer to provide resource estimates and switching rates based on the designer's vision of how the FPGA design will function in the field after implementation. These tools cannot adapt to variations in the relevant parameters during actual operation.

Total power may be derived based on the supplied voltage multiplied by the actual current being drawn through the FPGA. However, measuring total current flowing through the FPGA is problematic. External devices, such as an ammeter, must be attached to power inputs to the FPGA, or through a circuit board interface feeding the FPGA. Additional devices add to the complexity and cost of design. Additionally, the connections between the FPGA and the circuit board must be disturbed to accommodate the external devices. Alternative techniques for estimating total power consumption of an FPGA during operation without the need for external devices or disruption of the circuit board are desired.

SUMMARY

A method of calculating total power usage of a field programmable gate array (FPGA) without the use of external components comprises generating one or more coefficients based on a power equation and a given FPGA logic design. The power equation calculates FPGA power as a function of temperature and voltage. The coefficients are applied to the power equation which also receives temperature and voltage values indicative of internally measured values. It is contemplated that multiple coefficients may be used and that some coefficients may have a greater effect on the calculated power measurement value than others. It is further contemplated that in an alternative embodiment some coefficients may be static and not generated as part of the curve-fitting process for determining coefficients utilized in the power equation. At least one coefficient must be generated to provide a real time power equation capable of being adapted by the at least one coefficient to generate a real-time power usage measurement value according to a given logic design of the FPGA. The received temperature measurement and the voltage measurement values are applied to the power equation with the at least one coefficient to calculate a power measurement based on the temperature measurement and the voltage measurement values. The at least one coefficient is generated by taking an FPGA design model and iteratively simulating the design in a power estimation tool over a range of temperature and input voltage values. A characterization data set is generated and curve fitted to the power equation to produce coefficients.

In one embodiment, a method for determining in real time a power usage of a field programmable gate array (FPGA) without the use of external components, comprises: a) storing in a memory on the FPGA one or more coefficients associated with a power usage formula, the one or more stored coefficients determined according to a curve fit power estimate of said power usage formula for said FPGA over a range of temperatures and voltages, and further based on a given logic design model of said FPGA; b) sensing in real-time on the FPGA a temperature of the FPGA; c) sensing in real-time on the FPGA an input voltage applied to the FPGA; d) determining in real-time the power usage of the FPGA based on the sensed temperature of the FPGA, the input voltage of the FPGA, and at least one of the stored one or more coefficients, according to said power usage formula; wherein sensing the temperature and the input voltage are performed without use of external components.

In another embodiment, a system for determining in real time a power usage of a field programmable gate array (FPGA), comprises: a) a memory on the FPGA for storing one or more coefficients associated with a power usage formula, the one or more stored coefficients determined according to a curve fit power estimate of said power usage formula for said FPGA over a range of temperatures and voltages, and further based on a given logic design model of said FPGA; b) a sensor on the FPGA for determining in real-time a temperature of the FPGA without use of external components; c) a sensor on the FPGA for determining in real-time an input voltage applied to the FPGA without use of external components; d) a processor on the FPGA for determining in real-time the power usage of the FPGA based on the sensed temperature of the FPGA, the determined input voltage of the FPGA, and at least one of the stored one or more coefficients, according to the power usage formula.

In another embodiment, a non-transitory computer readable medium upon which are stored instructions, the instructions when executed by a processor, cause the processor to: a) determine in real-time on the FPGA a temperature of the FPGA without use of external components; b) determine in real-time on the FPGA an input voltage applied to the FPGA without use of external components; c) retrieve from a memory on the FPGA one or more coefficients associated with a power usage formula, the one or more coefficients determined according to a curve fit power estimate of said power usage formula for said FPGA over a range of temperatures and voltages, and further based on a given logic design model of said FPGA; d) determine in real-time the power usage of the FPGA according to said power usage formula and based on the determined temperature of the FPGA, the input voltage of the FPGA, and the retrieved one or more coefficients.

The non-transitory computer readable medium further comprises instructions that when executed by a processor remote from the FPGA cause the processor when generating the at least one coefficient to: analyze an FPGA logic design; iteratively simulate the FPGA logic design using a power estimation tool, the simulation performed over a range of temperature values and a range of input voltage values to provide a plurality of power estimate values; generate a characterization data set based on the power estimate values; generate the at least one coefficient for use in the power usage formula by curve fitting the characterization data set to a data set representing the power usage formula over a range of temperature values and voltage values, wherein the establishing, iteratively simulating, generating the characterization data set, and generating said at least one coefficient, are performed in an off-line mode prior to said real time processing on the FPGA.

BRIEF DESCRIPTION OF THE DRAWINGS

The description provided in this specification may be better understood with reference to the accompanying drawings in which like parts are indicated by like numerals and wherein.

DETAILED DESCRIPTION

Figure 1:
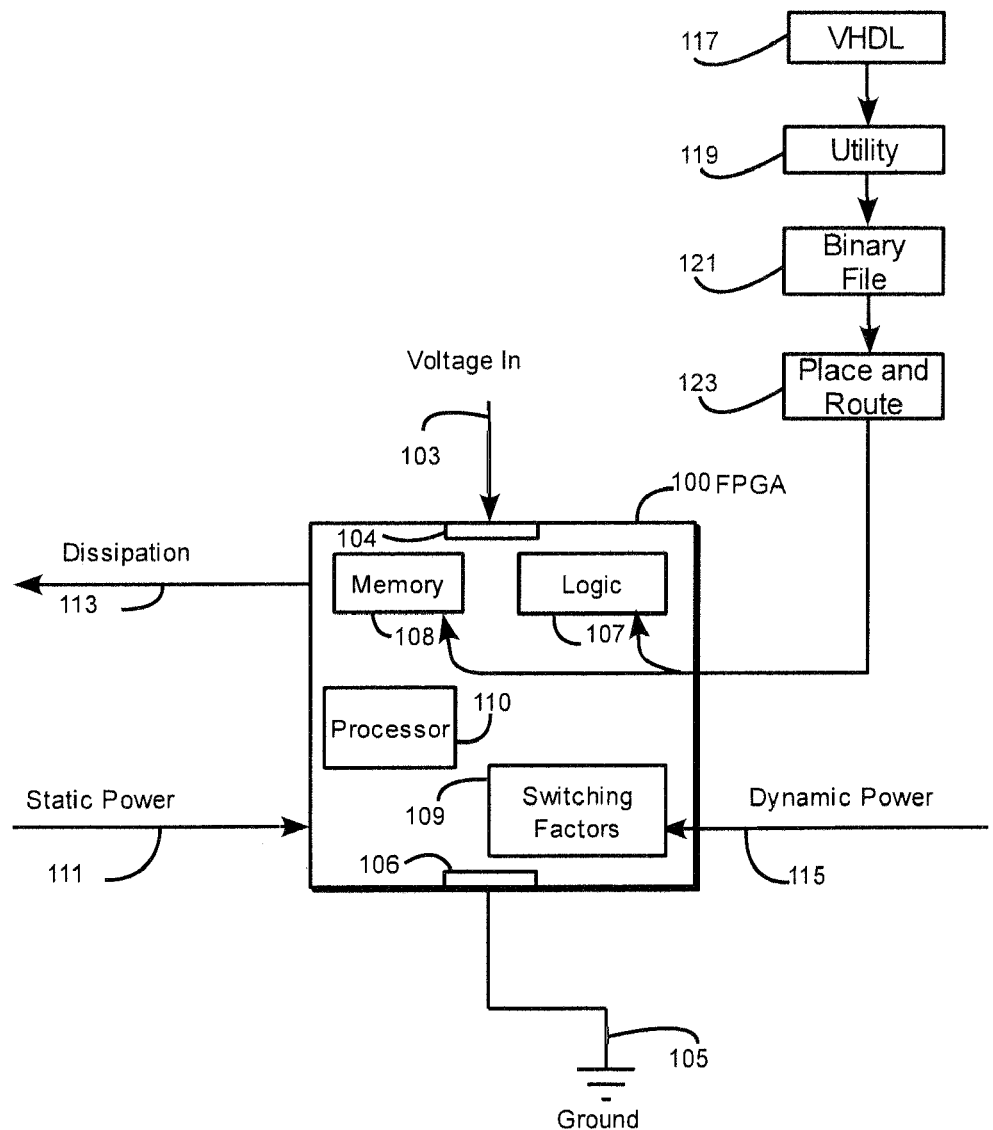
FIG. 1 is a block diagram of an FPGA configurable for power measurement without external components.

FIG. 1 is a block diagram of an FPGA 100 according to an embodiment of the invention. The FPGA 100 is powered through terminal pins by an input voltage 103 applied to a terminal input 104. The FPGA 100 is connected to ground 105 through another terminal input 106. Input voltage 103 provides electrical potential needed to power the electrical functions of circuit logic 107, memory 108 and switching factors 109 as well as providing power to processor 110 within the FPGA 100. The FPGA 100 is designed and implemented by a utility program 119 (e.g. software and/or hardware utility) provided by the FPGA 100 manufacturer in a process called a "place and route" 123. The design is created in a language specified for the purpose of FPGA design. For example, very high speed integrated circuit Hardware Description Language (VHDL) 117 may be used. The VHDL 117 is loaded to the software utility 119 which generates a binary file 121 that is used to place and route 123 the FPGA 100 and perform the physical connection of the logic units 107 and memory 108 in the FGPA 100.

In addition to logic 107, memory 108 is defined for storing information needed during intended operation of the FPGA 100 circuitry. Switching factors 109 associated with the FPGA design represent data changes occurring within the logic 107 and memory 108 registers during expected operating conditions of the FPGA 100.

Switching factors 109 contribute to the dynamic power 115 used by the FPGA 100 and is represented by an arrow applied to the FPGA 100. The dynamic power 115 is related to the input voltage 103 and the current required to perform switching operations at a given time.

Static power 111 (also referred to as "leakage") relates to the power used by the FPGA as a result of semi-conductor manufacture and is represented by an arrow applied to the FPGA 100. That is, static power 111 represents the power leaked by the transistors in the FPGA used to implement switches in the logic 107 and memory 108 when the FPGA 100 is powered. Static power 111 does not include power required due to switching operations 109.

Dissipation 113 is power that is released due to losses within the FPGA 100 and is represented by an arrow extending from the FPGA 100. Dissipation 113 is related to static power as opposed to dynamic power, in which the power is used for switching operations and not lost to the environment. Dissipation 113 losses are observable through temperature increases within the FPGA 100. Thus, die temperature may provide information relating to static power losses. However, it does not provide a complete picture of the total power used by an FPGA 100 design.

Figure 2:
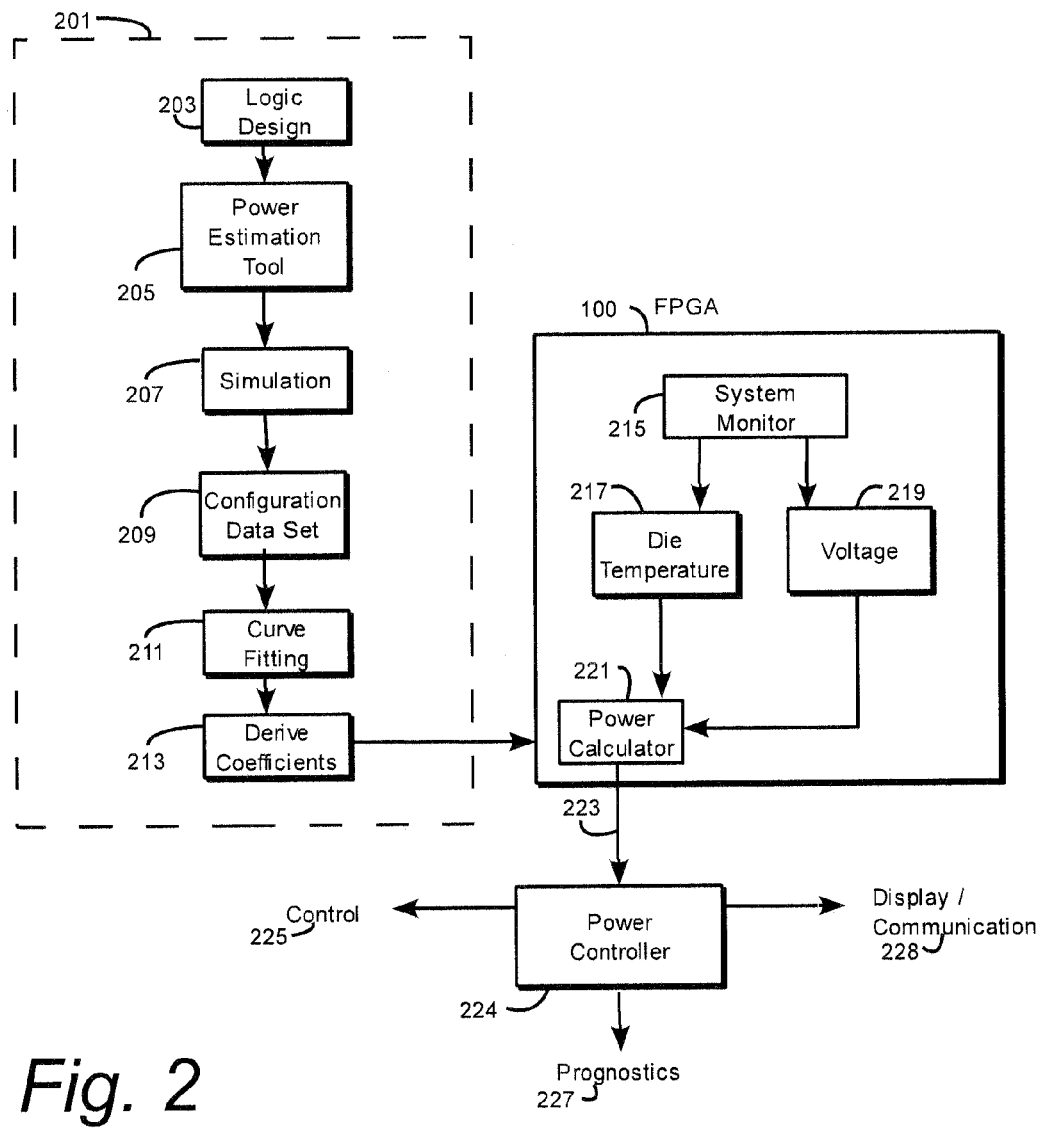
FIG. 2 is a block diagram of an FPGA configured to measure real time total power usage.

FIG. 2 is a block diagram of an FPGA 100 including real time total power measurement without the use of external components. Coefficients are applied to the FPGA to assist in the real-time power determination process. The FPGA 100 receives from the coefficient derivation process 201, a set of coefficients 213 for use in real time power measurement of the FPGA. Coefficients 213 are stored in FPGA memory and applied to static and dynamic power equations to calculate real time power for the FPGA 100 design under consideration. The coefficients 213 are derived by process 201 which is performed typically once prior to FPGA implementation (i.e. prior to real time processing and operations by the FPGA 100). The "off-line" or non-real time derivation process 201 generates coefficients based on curve fitting a configuration data set of power estimates obtained based on simulation runs over a range of temperatures and voltages using a logic design model of the FPGA 100, with a given power equation. The one or more coefficients 213 derived according to the non-real time or "off-line" process 201 are subsequently stored in memory within the FPGA 100. The remaining elements of FIG. 2 relate to elements and functions associated with post implementation processing of the FPGA 100 and are performed in real time using real time data collected during the intended operation of FPGA 100 in conjunction with the coefficients derived during the pre-implementation stage and stored in FPGA memory. It is contemplated that multiple coefficients may be used and that some coefficients may have more effect on the calculated power measurement value than others. Therefore, it is further contemplated that in an alternative embodiment some coefficients may be static and therefore not generated in the curve-fitting process of the power equation. At least one coefficient must be generated to provide a dynamic power equation capable of being adapted by the at least one coefficient to generate a real-time power usage measurement value according to a given logic design of the FPGA.

A pre-implementation stage coefficient derivation process 201 begins with the logic design 203 associated with an FPGA implementation design. The coefficient derivation process 201 may be performed on a conventional computer or computer workstation. The computer workstation, for example, may be a personal computer (PC) running the WINDOWS™ operating system. As is known in the art, such a computer workstation is equipped at a minimum with a processor, memory, input/output interfaces and a data bus communicatively coupling the above components. The logic design 203 includes information relating to the FPGA internal logic design including, for example, the average number of switching operations, the number and percentage of available resources used and the clock frequencies used as part of the circuitry design. The FPGA is placed and routed based on the logic design. The circuitry design is then used to generate a spatial archive interchange format (SAIF) file containing the actual circuitry components. The SAIF file provides actual circuit parameters to a power estimation tool. The parameters are used as input to power estimation tool 205 as is known in the art to estimate power usage of the logic design 203. For example, the XPower Estimator tool provided by Xilinx, Inc. may be used as an exemplary power estimation tool 205. The logic design 203 parameters may be entered into the power estimation tool 205 manually based on the designer's knowledge of the particular FPGA implementation. In the event a more accurate pre-implementation estimate is desired, a predetermined switching characteristics file (e.g. SAIF file) may be loaded into the power estimation tool 205. The switching characteristics file may contain detailed information regarding the logic design 203 of the FPGA 100 design. For example, a SAIF file may be used as an input to the power estimator tool 205 and executed in order to model the switching of the transistors/circuit components in the FPGA under test based on an exemplary data set the FPGA may be working on to provide an accurate dynamic power calculation. The power estimation tool 205 allows a user to vary factors (such as temperature and input voltage) and generates estimated power levels based on logic design 203 for those factors (e.g. based on a given pair of values for temperature and input voltage).

Based on the logic design 203, the power estimator 205 runs iterative simulations 207. Each simulation 207 is performed using a different temperature and/or input voltage from a pre-determined range of operating temperatures and input voltages. For each simulation 207, the power estimation tool 205 calculates an estimated power level.

The resulting power estimates are collected and stored in memory to create a characterization data set 209. The characterization data set 209 represents expected power usage of the proposed logic design 203 over varying temperature and voltage conditions.

The characterization data set 209 is input to a curve fitting tool 211. For example the MATLAB sftool may be used as a curve fitting tool 211. The curve fitting tool 211 is configured to generate a set of coefficients 213 based on the calculated values over the temperatures and voltages used in the simulations 207. The coefficients 213 are applied to static and dynamic power equations stored in memory 108. Such power equations are known in the art. For example, the power equation described herein below as Equation 8 may be used to curve map simulated data at varying temperatures and voltages to generate coefficients to Equation 8. A detailed discussion of the derivation of Equation 8 is described below. It is contemplated that other power calculation equations may be used to generate more of fewer coefficients that may be used in real-time power calculation in an FPGA. The power equation used to fit the characterization data set is used by a power calculator in the FPGA in real-time to calculate power usage based on the current chip temperature and voltage applied to the FPGA. The power equations are modified, however, to include the generated coefficients 213 such that static and dynamic power may be calculated based only on die temperature and input voltage as inputs. The coefficients 213 are derived once for the logic design 203 and may be included in a file during implementation such that the FPGA 100 contains the coefficients 213, storing them in a memory (e.g. registers) within the FPGA 100 for later retrieval.

The FPGA 100 includes a system monitor 215 which provides various operating parameters of the FPGA 100 and stores these values in registers for access by other applications. The system monitor 215 is a utility (e.g. implemented in hardware) embedded in the FPGA for providing real-time operating statistics of the FPGA. This utility may be provided by the FPGA manufacturer. For example, the Xilinx Virtex-5 FPGA system monitor may serve as system monitor 215. The system monitor includes a voltage sensing function and temperature sensing function. As shown in FIG. 2, the system monitor 215 is internal to FPGA 100. System monitor 215 provides the current die temperature 217 of the FPGA 100 and the current operating input voltage 219. The die temperature 217 and the voltage 219 serve as inputs to power calculator processor 221. As described above, coefficients 213 (previously determined by means of the "off-line" or pre-implementation iterative power estimation simulation, analysis, and curve fitting) stored in memory (108 FIG. 1) of FPGA 100 and derivations may be applied during real-time operation to modified static and dynamic power equations to calculate power usage using only temperature and voltage as inputs. Power calculator processor 221 applies coefficients 213 to the power equations and applies (e.g. substitutes) the values of internally measured die temperature 217 and voltage 219 to compute the real time power measurement 223 of FPGA 100 using the coefficients retrieved from memory 108 (FIG. 1). Derivation of the power equations is described below.

The real time power measurement value 223 may be used as input to a power controller 224 (either on/off chip) to provide FPGA 100 circuit control signal information 225. For example, mezzanine technology involves the use of a base card wherein another card is plugged into the base card. The connectors between the two cards may be subject to a standard, for example, the VMEbus international trade association (VITA). The standard may limit current through the connection at, for example 10-12 Amperes (Amps). On a condition that an FPGA 100 requires 20 Amps to operate, the real time power measurement value 223 may be used to indicate the interface may fall out of spec if the required current is applied. A control signal may be provided in response to said determination to reduce power consumption. For example, a signal decimating the FPGA clock frequency may be applied to thereby reduce power consumption to a sufficiently low level to keep the FPGA connection compliant with the appropriate specification.

The amount of power used by a device may provide information related to the probability of future failure. The real time power measurement 223 may be used to provide a prognostic indicator such as indicator 227 (e.g. a bit) to a third party application (not shown) for tracking the power usage of the FPGA 100 over time. The third party application may poll the FPGA for power usage periodically and maintain a history of power readings. In another embodiment, a history of power levels (e.g. average power levels) over time is stored in memory. Over the lifetime of a device, the amount of power consumed may be indicative of the remaining life of the device. An FPGA operating at 4 watts over its lifetime may be expected to last longer than a like FPGA operating at 12 watts for the same period of time. Prognostics data 227 may be used to predict the potential failure of the device based on probability of failure resulting from power usage.

Data indicative of the power measurement values 223 may also be provided to a display/communication 228 device. An operator may be provided real time power measurement data to monitor ongoing operations. Additionally or alternatively, a real time power measurement value 223 may be communicated through an appropriate communications interface to an external resource to provide information on the power usage of the FPGA 100 during operation.

The total power usage of an FPGA may be expressed as:

$$\text{Power}_{FPGA} = \text{Power}_{static} \text{Power}_{dynamic} \quad (1)$$

and $$\text{Power}_{static} = \text{Voltage (V)} \times \text{Leakage Current} (I_{Leakage}) \quad (2)$$

Leakage current, which results in static power loss, is a function of the die temperature. Thus, the higher the temperature, the more current is leaking. The static power relates to the power lost in logic devices (e.g. transistor logic) in the FPGA when no switching operations are conducted. Static power losses are due to the properties of semi-conductor manufacturing and do not contribute to power usage as a function of logic design. Leakage current may be expressed by:

$$I_{Leakage} = i_s((e^{(qv/kT)}) - 1) \quad (3)$$

where:
q is electronic charge;
v is diode voltage;
$i_s$ is reverse saturation current;
k is Boltzmann's constant;
and T is temperature.

In an example FPGA where the input voltage ($V_{CCInt}$) supply has a range of 0.95 volts to 1.05 volts (v) and a die temperature range of −40°-85° Celsius (C.), the first order effect is temperature and the effect of the voltage spread is negligible. Thus, Equation (3) may be re-written as:

$$I_{Leakage} = A \times e^{BT} \quad (4)$$

where
A is an equation or coefficient;
B is a coefficient; and
T is temperature in degrees Celsius.

It is observed, however, that at higher temperatures, the impact of voltage causes a spread in the values of $I_{Leakage}$ which may be modeled by a polynomial replacing coefficient A in Equation (4) to model the voltage impact. This results in a static power equation according to:

$$P_{static(v,T)} = (a_1 V^3 + a_2 V^2 + a_3 V + a_4) \times e^{BT} \quad (5)$$

Equation (5) is used to describe static power in the FPGA which contributes to the total power measurement. The coefficients, $a_1, a_2, a_3$, and $a_4$ are derived in accordance with that described above with regard to FIG. 2, process 201 and with regard to FIG. 3 described below.

Dynamic power may be defined by Equation (6):

$$P_{dynamic} = C \times V^2 \times F \times nswb \quad (6)$$

where
C is dynamic power-dissipation capacitance;
V is supply voltage (v);
F is frequency (Hz);
and nswb is the number of switching bits.

As shown in Equation (6), there is no temperature dependency in calculating dynamic power. Since the values of C, V and F are fixed in a final design of an FPGA, Equation (6) may be re-written as:

$$P_{dynamic} = (b_1 V^2 + b_2 V + b_3) \quad (7)$$

Coefficients $b_1, b_2$, and $b_3$ are derived in accordance with that described above with regard to FIG. 2, process 201 and with regard to FIG. 3 described below.

Substituting Equations (5) and (7) into Equation (1) results in:

$$\text{Power}_{FPGA} = P_{const} + (a_1 V^3 + a_2 V^2 + a_3 V + a_4) \times e^{BT} + (b_1 V^2 + b_2 V + b_3) \quad (8)$$

where $P_{const}$ represents the non-changing power value that contributes to the power usage of the FPGA but cannot be determined from the system monitor. $P_{const}$ is constant for a given logic design and therefore does not flux.

Equation (8) provides an equation for calculating total FPGA power using only temperature and voltage as inputs. The curve matched coefficients are applied to the power equation, thus allowing a real-time power calculation to be performed based only on temperature and voltage, which may be provided by a system monitor utility.

Figure 3:
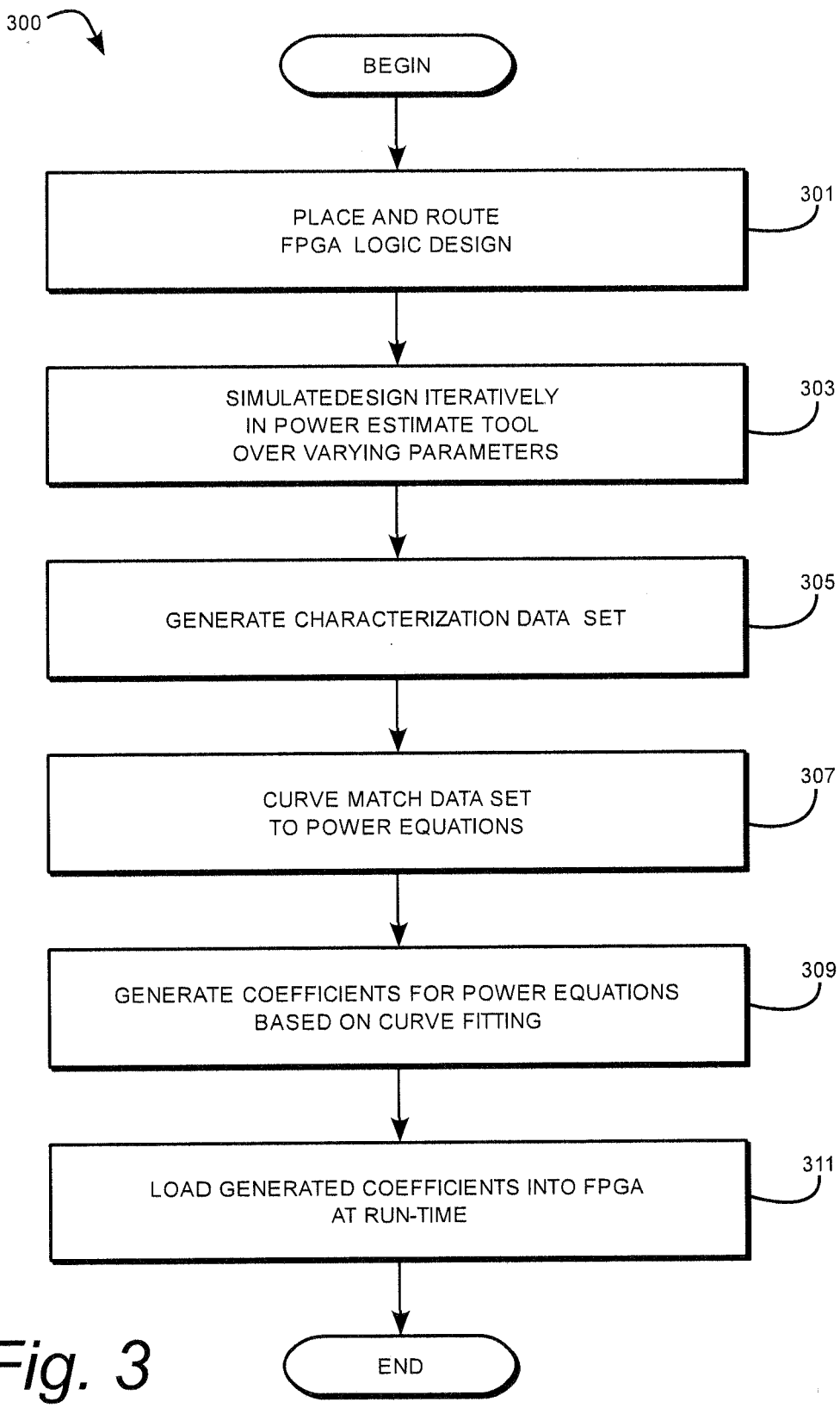
FIG. 3 is a flow diagram of a method for generating coefficients for a modified power equation.

FIG. 3 is a flow diagram of a method for generating coefficients 300 a and b for Equation (8). In block 301, a logic design for an FPGA is developed and placed and routed into the FPGA. The logic design includes all features of the design that consume power in the FPGA, for example, clock frequencies, resource usage and switching factors. Resource usage refers to logic units utilized in the FPGA design and may include registers, memory elements, multipliers and the like. The logic design may be documented in a SAIF file which may be fed into a power estimation tool to provide a more accurate accounting of components in the FPGA logic design than entering the components manually.

The details of the FPGA design are input to a power estimation tool, for example, an SAIF file generated from the logic design may be used to accurately report all logic design components to the power estimation tool. Power estimation tools are utilities that may be provided by an FPGA manufacturer to provide a pre-implementation estimate of how much power a given FPGA design will use. For example, the XPower Estimator from Xilinx, Inc. is a suitable power estimation tool for providing pre-implementation power estimates. Power estimation tools allow different inputs for operating parameters to be entered along with the logic design to provide a power usage for a proposed logic design under given conditions. For example, power estimates for the logic design may be estimated over a range of values for parameters such as temperature and voltage. The power estimation tool is run iteratively to simulate the logic design during FPGA operations over varying parameter values and compute estimated power usage values. Each iteration varies inputs over a range of parameters such as temperature and a input voltage as shown in block 303. Power estimation tools are configured to provide single power estimates for one set of input data, therefore, the iterative simulations may be configured to be performed using an automated process. For example, a batch command file may be used to provide the multiple inputs and collect the resulting power estimates. Other methods of automating the simulations may be conceived by one skilled in the art and are included in the intended scope of this specification.

The power estimates provided by the iterative simulations are collected and stored in memory, for example, in a computer workstation, to create a characterization data set as shown in block 305. The characterization data set contains the power estimates based on the logic design analyzed over varying temperatures and voltages. The characterization data set provides information about the power consumption of the specific logic design over varying operating conditions and are used to compare the data generated by the simulations, to known power equations and generate a set of coefficients that map the characterization data set to the known equations.

The characterization set is used as input to perform a curve fitting operation applied to power equations that calculate dynamic and static power as shown in block 307. Power equations for FPGA's and other semi-conductor devices are known in the art. The power equations are modified as described above to contain coefficients which adapt the power equations to a specific logic design. For example, in Equation (5), the coefficients are in the form of a third order polynomial of coefficient $a_{1-4}$ times voltage. The characterization data set is curve fitted to the modified power equations to derive a set of coefficients such that the coefficients do not change over the characterization data set when applied to the modified power equations. The result is a generated set of coefficients for a given FPGA design that produce an accurate real time power measurement based only on temperature and voltage as inputs (block 309).

The generated coefficients are loaded to the FPGA by means of a software load utility at run-time, for example, when the FPGA is put into service. (block 311). The coefficients may be loaded to registers in the FPGA where they may be retrieved during a power calculation by the processor 221. The system monitor utility onboard the FPGA provides die temperature and voltage measurements. The temperature and voltage measurements are used as inputs to the modified power equation (i.e. Equation (8)) along with the generated coefficients to provide an accurate real-time power measurement.

Figure 4:
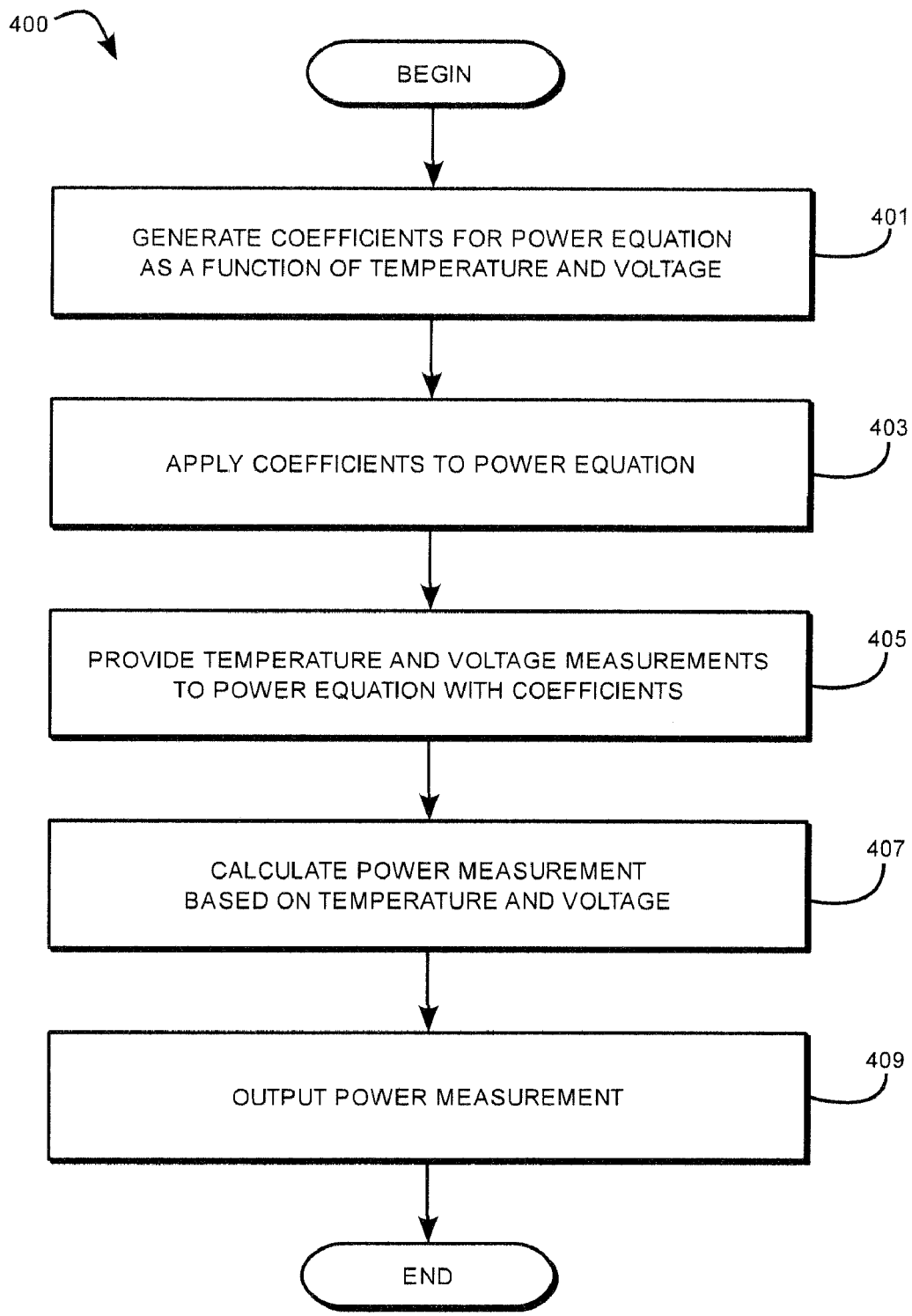
FIG. 4 is a flow diagram of a method for calculating FPGA total power without external components.

FIG. 4 is a flow diagram of a method for calculating real-time total power usage in an FPGA without external components 400. Coefficients are generated for a power equation such that the power equation calculates a real-time power measurement based on a given FPGA design as shown in block 401. The coefficients are applied to the power equation (block 403) such that the power equation calculates real-time power usage based on a given logic design using only temperature and voltage as inputs. A temperature measurement and a voltage measurement are provided by a system monitor utility internal to the FPGA. The system monitor utility is a utility embedded in the FPGA for providing real-time operating statistics of the FPGA. For example, the Xilinx Virtex-5 FPGA system monitor may serve as the system monitor utility. The temperature and voltage measurements are provided to the power equation with the coefficients applied as shown in block 405. Using the temperature and voltage measurements as inputs, a power measurement is calculated based on the provided temperature and voltage utilizing the power equation with coefficients applied to the power equation (block 407). The calculated power measurement is output (block 409). By way of example, the power measurement output may be used for system control, prognostics, and/or display/communication.

The method of internal power estimation inside an FPGA may be implemented in hardware, software or a combination of both. For example, some modules may be implemented in hardware and other modules implemented in software in any combination. Software may be stored in the form of instructions that when executed by a processor, cause the processor to form some or all of the method steps. The software instructions may be stored on a non-transitory computer readable medium. The computer readable medium, for example, may be a flash memory, random access memory (RAM), read only memory (ROM), an optical disk, magnetic disk or other form factor of memory suitable for storing said instructions.

The above description is provided by way of example does and not limit the scope of the invention. One skilled in the art may provide minor substitutions or alternatives which fall within the intended scope of the invention. The invention is limited only to the set of accompanying claims.

What is claimed is:

1. A method for determining in real time a power usage of a field programmable gate array (FPGA) without the use of external components, comprising:
   a) storing in a memory on the FPGA one or more coefficients associated with a power usage formula, the one or more stored coefficients determined according to a curve fit power estimate of said power usage formula for said FPGA over a range of temperatures and voltages, and further based on a given logic design model of said FPGA;
   b) sensing in real-time on the FPGA a temperature of the FPGA;
   c) sensing in real-time on the FPGA an input voltage applied to the FPGA;
   d) determining in real-time the power usage of the FPGA based on the sensed temperature of the FPGA, the input voltage of the FPGA, and at least one of the stored one or more coefficients, according to said power usage formula;
   wherein sensing said temperature and said input voltage are performed without use of external components.

2. The method of claim 1, wherein the power usage formula is proportional to input voltage and temperature of said FPGA and wherein in said determining step, at least one of the coefficients of said power usage formula are said stored coefficients determined according to the curve fit power estimate of step (a).

3. The method of claim 2, wherein the power usage formula defines a total power usage proportional to $$(a_1 V^3 + a_2 V^2 + a_3 V + a_4) \times e^{BT} + (b_1 V^2 + b_2 V + b_3);$$

wherein at least one of the coefficients $a_1$, $a_2$, $a_3$, $a_4$, $b_1$, $b_2$, $b_3$, of said power usage formula applied in said determining step, are the stored coefficients determined according to the curve fit power estimate of step (a); and wherein B is Boltzmann's constant;
T is the sensed temperature in degrees Celsius; and
V is the sensed input voltage.

4. The method of claim 2, wherein for the one or more stored coefficients determined according to a curve fit power estimate of said power usage formula for said FPGA over a range of temperatures and voltages, and on a given logic design of said FPGA, the method further comprises the steps of:
   establishing the logic design model of the FPGA;
   iteratively simulating the FPGA logic design using a power estimation tool, the simulation performed over a range of temperature values and a range of input voltage values to provide a plurality of power estimate values;
   generating a characterization data set based on the power estimate values;
   generating the at least one coefficient for use in the power usage formula by curve fitting the characterization data set to a data set representing the power usage formula over a range of temperature values and voltage values, wherein the establishing, iteratively simulating, generating the characterization data set, and generating said at least one coefficient, are performed in an off-line mode prior to said real time processing steps.

5. The method of claim 2, wherein the power formula for FPGA power is a function of temperature and voltage, and wherein the generating at least one coefficient for the power equation based on the curve fitting is such that the at least one coefficient value does not change over the characterization data set.

6. The method of claim 2, further comprising loading the at least one coefficient generated in off-line mode into memory in the FPGA at run-time.

7. The method of claim 2, further comprising outputting data indicative of the real-time determined power usage of the FPGA for displaying the FPGA power usage on a display device.

8. The method of claim 1, further comprising outputting a prognostic indicator to an external source for tracking the power usage of the FPGA 9. The method of claim 1, further comprising comparing the value of the real-time determined power usage with a threshold value and outputting a control signal for reducing FPGA power when said determined power usage exceeds said threshold.

10. A system for determining in real time a power usage of a field programmable gate array (FPGA), comprising:
 a) a memory on the FPGA for storing one or more coefficients associated with a power usage formula, the one or more stored coefficients determined according to a curve fit power estimate of said power usage formula for said FPGA over a range of temperatures and voltages, and further based on a given logic design model of said FPGA;
 b) a sensor on the FPGA for determining in real-time a temperature of the FPGA without use of external components;
 c) a sensor on the FPGA for determining in real-time an input voltage applied to the FPGA without use of external components;
 d) a processor on the FPGA for determining in real-time the power usage of the FPGA based on the sensed temperature of the FPGA, the determined input voltage of the FPGA, and at least one of the stored one or more coefficients, according to said power usage formula.

11. The system of claim 10, wherein the power usage formula is proportional to input voltage and temperature of said FPGA, and wherein at least one of the coefficients of said power usage formula used by said processor for determining in real-time said power usage are said stored coefficients determined according to the curve fit power estimate.

12. The system of claim 11, wherein the power usage formula defines a total power usage proportional to:

$$(a_1V^3+a_2V^2+a_3V+a_4)\times e^{BT}+(b_1V^2+b_2V+b_3);$$

wherein at least one of the coefficients $a_1$, $a_2$, $a_3$, $a_4$, $b_1$, $b_2$, $b_3$, of said power usage formula applied by said processor, are the stored coefficients determined according to the curve fit power estimate; and wherein B is Boltzmann's constant;
T is the sensed temperature in degrees Celsius; and
V is the determined input voltage.

13. The system of claim 11, wherein for the one or more stored coefficients determined according to a curve fit power estimate of said power usage formula for said FPGA over a range of temperatures and voltages, the system further comprises:
 a logic design model of the FPGA stored in memory remote from the FPGA;
 a power estimation module remote from the FPGA for iteratively simulating the FPGA logic design over a range of temperature values and a range of input voltage values to provide a plurality of power estimate values;
 a processor remote from the FPGA configured to generate a characterization data set based on the power estimate values and curve fit the characterization data set to a data set representing the power usage formula over a range of temperature values and voltage values to generate the at least one coefficient for use in the power usage formula for execution by the processor on the FPGA.

14. The system of claim 13, wherein the power formula for FPGA power is a function of temperature and voltage, and wherein the remote processor generates the at least one coefficient for the power equation based on the curve fit such that the at least one coefficient value does not change over the characterization data set.

15. The system of claim 13, further comprising a software module for loading the at least one coefficient generated in off-line mode into memory in the FPGA, 16. The system of claim 13, further comprising a controller configured to output data indicative of the real-time determined power usage of the FPGA to a display device for displaying the FPGA power usage.

17. The system of claim 13, further comprising a controller configured to output a prognostic indicator to an external source for tracking the power usage of the FPGA .

18. The system of claim 13, further comprising a controller configured to compare the value of the real-time determined power usage with a threshold value and output a control signal for reducing FPGA power when said determined power usage exceeds said threshold.

19. A non-transitory computer readable medium upon which are stored instructions, the instructions when executed by a processor, cause the processor to:
 a) determine in real-time on the FPGA a temperature of the FPGA without use of external components;
 b) determine in real-time on the FPGA an input voltage applied to the FPGA without use of external components;
 c) retrieve from a memory on the FPGA one or more coefficients associated with a power usage formula, the one or more coefficients determined according to a curve fit power estimate of said power usage formula for said FPGA over a range of temperatures and voltages, and further based on a given logic design model of said FPGA;
 d) determine in real-time the power usage of the FPGA according to said power usage formula and based on the determined temperature of the FPGA, the input voltage of the FPGA, and the retrieved one or more coefficients.

20. The non-transitory computer readable medium according to claim 19, further comprising instructions that when executed by a processor cause the processor when generating the at least one coefficient to:
 analyze an FPGA logic design;
 iteratively simulate the FPGA logic design using a power estimation tool, the simulation performed over a range of temperature values and a range of input voltage values to provide a plurality of power estimate values;
 generate a characterization data set based on the power estimate values;
 generate the at least one coefficient for use in the power usage formula by curve fitting the characterization data set to a data set representing the power usage formula over a range of temperature values and voltage values, wherein the establishing, iteratively simulating, generating the characterization data set, and generating said at least one coefficient, are performed in an off-line mode prior to said real time processing on the FPGA.

* * * * *

UNITED STATES PATENT AND TRADEMARK OFFICE
CERTIFICATE OF CORRECTION

PATENT NO. : 8,217,679 B2
APPLICATION NO. : 12/899885
DATED : July 10, 2012
INVENTOR(S) : Luke A. Miller It is certified that error appears in the above-identified patent and that said Letters Patent is hereby corrected as shown below:

Column 7, Line 9, equation (1), a -- + -- symbol is inserted, such that the equation should read:

$$Power_{FPGA} = Power_{static} + Power_{dynamic} \qquad (1)$$

Signed and Sealed this
Twenty-eighth Day of August, 2012

David J. Kappos
*Director of the United States Patent and Trademark Office*